United States Patent [19]
Bishop

[11] 4,333,048
[45] Jun. 1, 1982

[54] THYRISTOR CONTROL CIRCUITS

[75] Inventor: Kenneth W. Bishop, Fareham, England

[73] Assignee: Plessey Overseas Limited, Illford, England

[21] Appl. No.: 198,651

[22] Filed: Oct. 20, 1980

[30] Foreign Application Priority Data

Oct. 26, 1979 [GB] United Kingdom ............. 7936507

[51] Int. Cl.³ .............................................. G05F 3/20
[52] U.S. Cl. ............................. 323/319; 307/252 UA
[58] Field of Search .................... 307/252 T, 252 UA; 323/235, 244, 299, 319

[56] References Cited

U.S. PATENT DOCUMENTS 3,283,177  11/1966  Cooper ............................. 323/319 X
3,940,634  2/1976   Grogan ......................... 307/252 T X
4,021,683  5/1977   Splatt ............................. 307/252 UA

FOREIGN PATENT DOCUMENTS 1086313  10/1967  United Kingdom .
1164065  9/1969   United Kingdom .
1253885  11/1971  United Kingdom .
1303281  1/1973   United Kingdom .
1486598  9/1977   United Kingdom .
1525701  9/1978   United Kingdom .

Primary Examiner—William M. Shoop
Attorney, Agent, or Firm—Fleit & Jacobson

[57] ABSTRACT

A thyristor control circuit arrangement which overcomes the problem of radio frequency interference comprises two parallel-connected oppositely-poled thyristors (TH1 and TH2) arranged to conduct alternatively for supplying power to a load (L) from an a.c. supply and thyristor control means (GA1–GA6 and LA1 and LA2) for detecting the polarity of the voltage across the parallel-connected thyristors (TH1 and TH2) and in response to the operation of ON/OFF control means consequently to condition one of the thyristors which has a negative voltage across it in readiness for immediate firing thereof as the voltage changes from a negative to a positive voltage.

5 Claims, 1 Drawing Figure

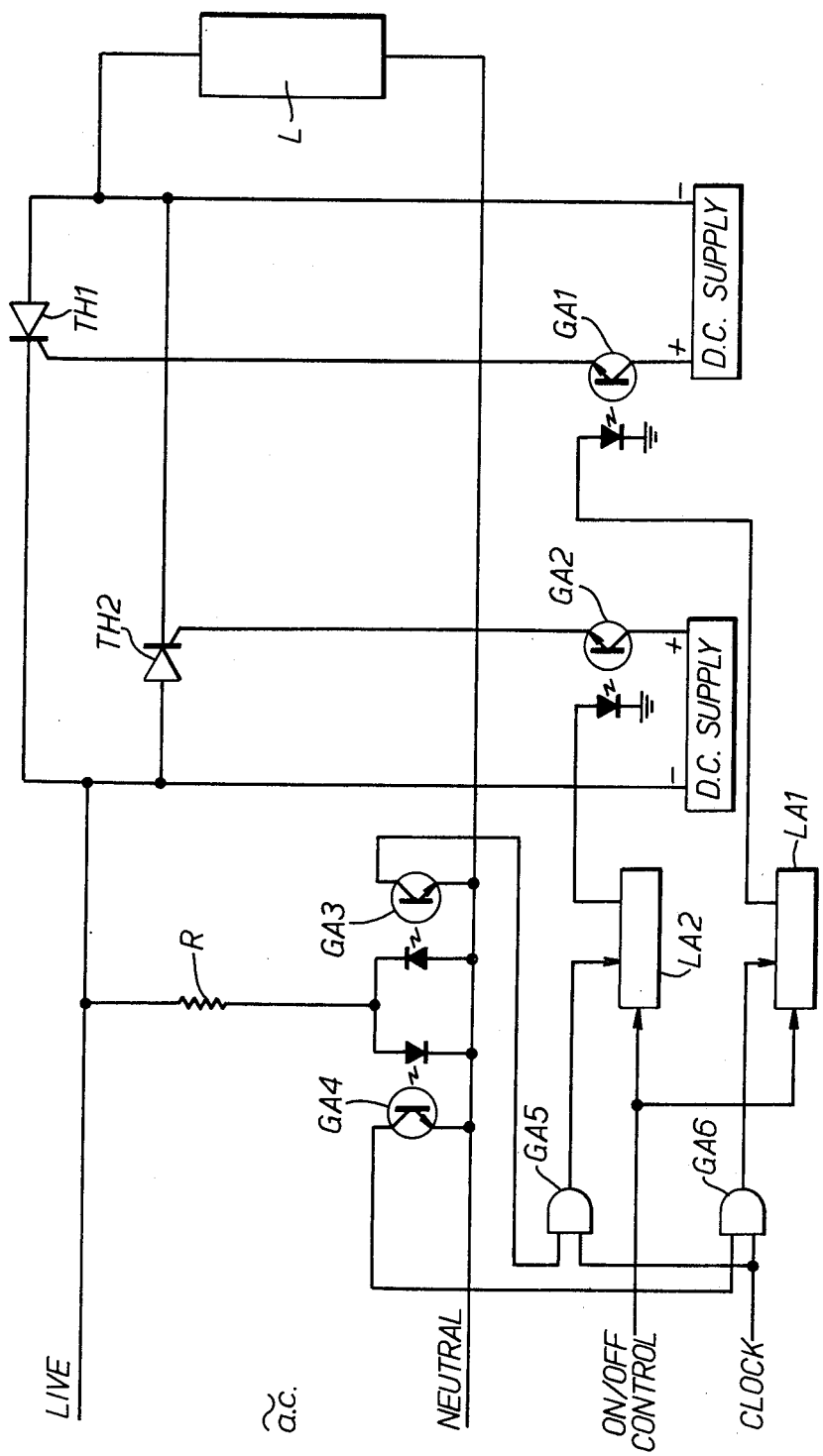

THYRISTOR CONTROL CIRCUITS

This invention relates to thyristor control circuits and relates more specifically to such control circuits for controlling the average power output from thyristors without the generation of radio frequency interference.

One known method of controlling power with thyristors is by retarding the phase of the thyristor gate voltage so that the thyristor fires late in the voltage cycle. Another known method is to allow a fixed number of cycles to be fed to the load. The former of these methods is known as phase control and the second as burst firing.

The second method of thyristor control has the advantage that during conduction periods there is only a small step voltage applied to the load unlike the phase control which can apply almost full peak voltage at large phase angles. This results in a considerable difference between the two methods as regards the level of generated radio frequency interference.

One technique for reducing still further the radio frequency interference generated by burst firing is to feed the thyristor gate electrodes with d.c. during conduction and only allow them to turn on when zero voltage appears across them. Due to the tolerances associated with detecting the zero voltage, the actual switching level can be up to 5 volts for initial turn on and still represents a source of radio frequency interference.

According to the present invention there is provided a thyristor control circuit arrangement which overcomes the problem of radio frequency interference, said circuit arrangement comprising two parallel-connected oppositely-poled thyristors arranged to conduct alternately for supplying power to a load from an a.c. supply and thyristor control means for detecting the polarity of the voltage across the parallel-connected thyristors and in response to the operation of on/off control means consequently to condition one of the thyristors which has a negative voltage across it in readiness for immediate firing thereof as the said voltage changes from a negative to a positive voltage.

It will be appreciated therefore that the thyristor conducts at the true zero crossing point of the a.c. supply and thereby avoids the generation of radio frequency interference. After the firing of the first thyristor the other thyristor will be similarly conditioned for conduction as the voltage across the parallel-connected thyristor changes to the opposite polarity. As in the case of the first thyristor, once the trigger or gate electrode of the other thyristor, has been conditioned for conduction of the thyristor it will remain in this condition until the aforesaid on/off control means is switched to the off condition.

The control means referred to may comprise various gating and latching means for voltage detection purposes and for initiating and maintaining the application of trigger potentials to the thyristors.

The gating means may for example comprise light-emitting diodes with associated photo-transistors.

By way of example the present invention will now be described with reference to the accompanying single-figure drawing which shows a circuit diagram of a thyristor power output control arrangement.

Referring to the drawing parallel-connected oppositely-poled thyristors TH1 and TH2 are arranged to be controlled for the purpose of controlling the average alternating current power supplied to a load L from an a.c. supply as indicated.

The triggering of thyristors TH1 and TH2 to conduction is under the control of respective gating devices GA1 and GA2 each of which comprises a light-emitting diode in association with a photo-transistor. Each of these gating devices GA1 and GA2 is arranged to conduct to apply positive d.c. potential to the trigger electrode of its appertaining thyristor in response to energisation of the photo-emitting diode in response to a positive output from a latching device LA1 or LA2, as the case may be.

The operation of these latching devices LA1 and LA2 to provide positive outputs is dependent upon the polarity of the potential across the thyristors TH1 and TH2. For determining this polarity the circuit arrangement comprises two further light-emitting diodes having associated photo-transistors connected in parallel and oppositely-poled relationship in series with a resistor R across the a.c. supply and defining gating devices GA3 and GA4. From a consideration of the circuit arrangement shown it will be seen that the gate GA4 will be opened when the "live" wire from the supply is positive with respect to "neutral" and the gate GA3 opens when the "live" wire is negative with respect to "neutral". Thus the gate GA4 will be opened when the thyristor TH1 has a negative voltage across it and gate GA3 will be opened when thyristor TH2 has a negative voltage across it.

The outputs from the gates GA3 and GA4 are fed, respectively, to inputs of two further gating devices GA5 and GA6. These gating devices which are "AND" gates have their second inputs connected in common to a clock pulse generator so that in the presence of clock pulses and earth (neutral) inputs these gates GA5 and GA6 will be opened to provide outputs for operating the respective latching devices LA2 and LA1, respectively, provided the latching devices are receiving an ON signal applied to them from ON/OFF control means. As previously mentioned, the outputs of the latching devices LA1, LA2 are arranged to open gates GA1 and GA2 respectively.

In operation of the arrangement, at the point of switching on of the arrangement both thyristors TH1 and TH2 will initially be in an un-triggered non-conducting condition.

The gating device GA3 or GA4 will be opened according to the polarity of the "live" wire of the supply. If it is positive with respect to "neutral" then the gating device GA4 will be opened and condition the gating device GA6 to open when a clock pulse is received at its other input as a consequence of which the output from the gate GA6 conditions latching device LA1 for opening when the ON/OFF control switch is in the "ON" condition. Once operated, this latching device LA1 will remain latched open until the ON/OFF control switch is returned to the "OFF" condition. The latching device LA1 accordingly provides an output which opens gate GA1 which applies a positive triggering potential to the thyristor TH1. When the polarity of the voltage on the "live" wire changes from positive to negative the thyristor TH1 will fire immediatey since it is already primed with a positive triggering voltage. At the same time the negative voltage on the "live" wire causes the gate GA3 to open which in turn causes the opening of gate GA5 upon the occurrence of the next clock pulse. As gate GA5 opens it causes operation of latching device LA2 which is also conditioned to operate by the input signal applied through the ON/OFF switch in its "ON" condition. Operation of the latching device LA2 effects opening of the gate GA2 and the application of positive potential to the trigger electrode of the thyristor TH2 so that the thyristor TH2 becomes primed ready to fire immediately the voltage on the "live" wire changes from negative to positive.

As will be apparent from the foregoing description of one exemplary embodiment of the invention the circuit arrangement according to the invention ensures that after switch on of the thyristor arrangement there is no delay at the time when the voltage changes to a polarity conducive to conduction of a thyristor and the application of the necessary positive triggering voltage to the thyristor, thereby avoiding the generation of radio frequency interference.

What we claim is:

1. A thyristor control circuit arrangement for supplying power from an a.c. supply to a load in accordance with an on/off control signal, said arrangement comprising:

two parallel-connected oppositely-poled thyristors arranged to conduct alternately;

first and second independent d.c. supplies; and thyristor control means for detecting the polarity of a voltage across the parallel-connected thyristors, and responsive to the on/off control signal for conditioning, from said first independent d.c. supply, one of the thyristors which has a negative voltage across it in readiness for immediate firing thereof as said voltage changes from a negative to a positive voltage, and said thyristor control means being responsive to said on/off control signal after said firing for similarly conditioning the other thyristor for immediate firing.

2. A thyristor control circuit arrangement as claimed in claim 1, wherein the thyristor control means comprises latching means for voltage detection and for initiating and maintaining the application of trigger potentials to the thyristors.

3. A thyristor control circuit arrangement as claimed in any one of claims 1 or 2, wherein the thyristor control means comprises light-emitting diodes with associated photo-transistors.

4. A thyristor control circuit arrangement for supplying power from an a.c. supply to a load in accordance with an on/off control signal, said arrangement comprising:

two parallel-connected oppositely-poled thyristors arranged to conduct alternately;

first and second independent d.c. supplies; and thyristor control means for detecting a given polarity of voltage across each of the parallel-connected thyristors, and responsive to detection of said given polarity of voltage across a first one of the parallel-connected thyristors and to the on/off control signal for conditioning, from said first independent d.c. supply, said first one of the parallel-connected thyristors in readiness for immediate firing thereof when the voltage across said one of the parallel-connected thyristors changes to a polarity opposite to said given polarity, said thyristor control means being further responsive to detection of said given polarity of voltage across a second one of the parallel-connected thyristors and to the on/off control signal for conditioning said second one of the parallel-connected thyristors in readiness for immediate firing thereof when said voltage across the second one of said parallel-connected thyristors changes to a polarity opposite to said given polarity.

5. A thyristor control circuit arrangement as claimed in claim 4, wherein the thyristor control means comprises opposing detector circuits connected to said a.c. supply for detecting respective polarities of voltage applied to said first and second parallel-connected thyristors, gating means connected to said opposing detector circuits and responsive to detection of said respective polarities of voltage applied to said first and second parallel-connected thyristors for issuing respective gating signals, a pair of latch circuits for receiving said respective gating signals and responsive thereto for latching the respective gating signals to produce respective latch outputs, and further means responsive to said respective latch outputs for issuing respective trigger outputs to trigger respective ones of said two parallel-connected thyristors.

* * * * *

UNITED STATES PATENT AND TRADEMARK OFFICE
CERTIFICATE OF CORRECTION

PATENT NO. : 4,333,048
DATED : June 1, 1982
INVENTOR(S) : Kenneth W. BISHOP

It is certified that error appears in the above—identified patent and that said Letters Patent is hereby corrected as shown below:

On the title page, before line "[51]" correct the date as follows:

Oct. 20, 1979 [GB] United Kingdom ............7936507

Signed and Sealed this

Fifth Day of October 1982

[SEAL]

Attest:

GERALD J. MOSSINGHOFF

Attesting Officer — Commissioner of Patents and Trademarks